US011386319B2

United States Patent
Le Gallo-Bourdeau et al.

(10) Patent No.: US 11,386,319 B2
(45) Date of Patent: Jul. 12, 2022

(54) TRAINING OF ARTIFICIAL NEURAL NETWORKS

(71) Applicant: International Business Machines Corporation, Armonk, NY (US)

(72) Inventors: Manuel Le Gallo-Bourdeau, Zurich (CH); Nandakumar Sasidharan Rajalekshmi, Thalwil (CH); Christophe Piveteau, Zurich (CH); Irem Boybat Kara, Zurich (CH); Abu Sebastian, Adliswil (CH); Evangelos Stavros Eleftheriou, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 755 days.

(21) Appl. No.: 16/352,922

(22) Filed: Mar. 14, 2019

(65) Prior Publication Data
US 2020/0293855 A1 Sep. 17, 2020

(51) Int. Cl.
*G06N 3/04* (2006.01)
*G06N 3/08* (2006.01)
(Continued)

(52) U.S. Cl.
CPC .............. *G06N 3/04* (2013.01); *G06N 3/063* (2013.01); *G06N 3/08* (2013.01); *G11C 13/0069* (2013.01)

(58) Field of Classification Search
CPC . G06N 3/04; G06N 3/063; G06N 3/08; G11C 13/0069
See application file for complete search history.

(56) References Cited

U.S. PATENT DOCUMENTS 9,195,934 B1 * 11/2015 Hunt ........................ G06N 3/02
9,779,355 B1 * 10/2017 Leobandung .......... G06N 3/084
(Continued)

OTHER PUBLICATIONS

Nugent, M. A., & Molter, T. W. (2014). AHaH computing-from metastable switches to attractors to machine learning. PloS one, 9(2), e85175. (Year: 2014).*

(Continued)

*Primary Examiner* — Kamran Afshar
*Assistant Examiner* — Lokesha G Patel
(74) *Attorney, Agent, or Firm* — Cantor Colburn LLP; Daniel Morris

(57) ABSTRACT

Methods and apparatus are provided for training an artificial neural network, having a succession of neuron layers with interposed synaptic layers each storing a respective set of weights {w} for weighting signals propagated between its adjacent neuron layers, via an iterative cycle of signal propagation and weight-update calculation operations. Such a method includes, for at least one of the synaptic layers, providing a plurality $P_l$ of arrays of memristive devices, each array storing the set of weights of that synaptic layer $S_l$ in respective memristive devices, and, in a signal propagation operation, supplying respective subsets of the signals to be weighted by the synaptic layer $S_l$ in parallel to the $P_l$ arrays. The method also includes, in a weight-update calculation operation, calculating updates to respective weights stored in each of the $P_l$ arrays in dependence on signals propagated by the neuron layers.

18 Claims, 7 Drawing Sheets

(51) Int. Cl.
*G06N 3/063* (2006.01)
*G11C 13/00* (2006.01)

(56) References Cited

U.S. PATENT DOCUMENTS

| 2015/0106316 A1* | 4/2015 | Birdwell | G06N 3/02 |
| | | | 706/33 |
| 2018/0067720 A1 | 3/2018 | Bekas et al. | |
| 2018/0211162 A1 | 7/2018 | Burr et al. | |

OTHER PUBLICATIONS

Ambrogio et al. "Equivalent-Accuracy Accelerated Neural-Network Training Using Analogue Memory," Nature 558.7708, 2018, pp. 60-67. Abstract.

Gokmen et al., "Training Deep Convolutional Neural Networks with Resistive Cross-Point Devices," Frontiers in Neuroscience, vol. 11, Article 538, 2017, 13 pages.

Nandakumar et al., "Mixed-precision training of deep neural networks using computational memory," arXiv preprint arXiv:1712.01192, 2017, 9 pages.

Song et al., "Pipelayer: A Pipelined ReRAM-Based Accelerator for Deep Learning," 2017 IEEE International Symposium on High Performance Computer Architecture (HPCA), IEEE, 2017, 12 pages.

* cited by examiner

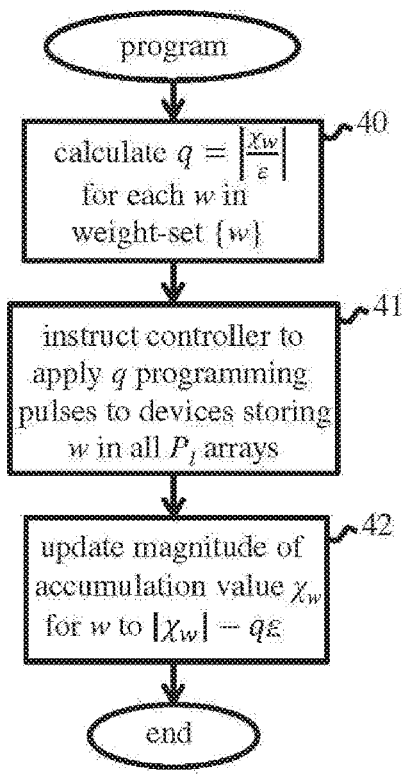
Figure 8
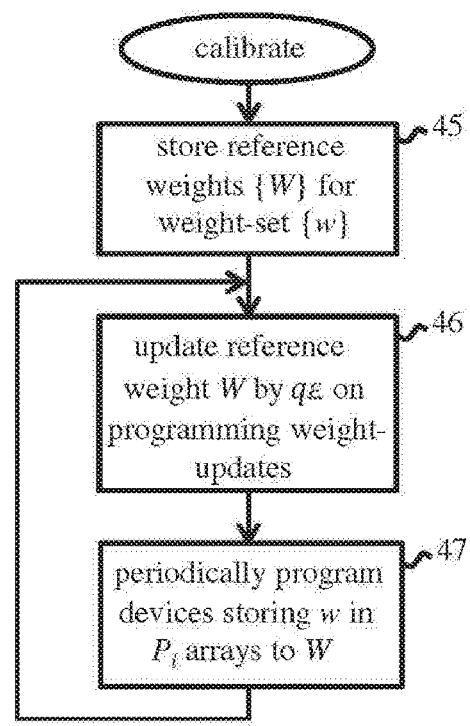
Figure 9
Figure 10

TRAINING OF ARTIFICIAL NEURAL NETWORKS

BACKGROUND

The present invention relates generally to training of artificial neural networks.

Artificial neural networks (ANNs) have been developed to perform computational tasks in a manner inspired by biological architectures of the nervous system. These networks are based on a fundamental principle of biological systems whereby neurons are interconnected via synapses which relay weighted signals between the neurons. ANNs are based on a logical structure comprising a succession of layers of neurons with interposed synaptic layers. The synaptic layers store the weights for weighting signals propagated between neurons in their adjacent neuron layers. A neuron $n_i$ in a given layer can be connected to one or more neurons $n_j$ in the next layer, and a different weight $w_{ij}$ can be associated with each neuron-neuron connection $n_i$-$n_j$ for weighting signals transmitted from $n_i$ to $n_j$. A neuron $n_j$ generates activation signals dependent on its accumulated inputs, whereby weighted signals can be propagated over successive layers of the network from an input to an output neuron layer.

ANNs have been successfully applied in various complex analysis tasks such as speech and image recognition, e.g. classification of hand-written digits based on the MNIST (Modified National Institute of Standards and Technology) dataset. An ANN undergoes a training phase in which the sets of weights for respective synaptic layers are determined. The network is exposed to a set of training data, e.g. image data for hand-written digits, in an iterative training scheme in which the weights are repeatedly updated as the network "learns" from the training data. Training involves an iterative cycle of signal propagation and weight-update calculation operations. In supervised learning of hand-written digits, for example, training examples from the MNIST dataset (for which the labels, here digit class from 0 to 9, are known) are repeatedly input to the network. In response to each network input, neuron activation signals are forward-propagated from the first to the last neuron layer, and errors are computed by comparing the network output signals to the expected network output for the input training example. The resulting error signals are then backpropagated through the network from the last neuron layer to the second neuron layer. Updates to the weights stored in each synaptic layer are calculated based on the activation and error signals propagated by the neuron layers in this signal propagation operation. The weights are thus progressively updated until a convergence condition is achieved. The resulting trained network, with weights defined via the training operation, can then be applied to perform tasks based on new (unseen) data for the application in question.

Training of ANNs, which can have multiple neuron layers and millions of synaptic weights, is a compute- and time-intensive task. The parallel computational capabilities of analog resistive memory arrays, in which the synaptic weights are stored in arrays of memristive devices, can be exploited to expedite training.

SUMMARY

According to at least one embodiment of the present invention there is provided a method for training an artificial neural network, having a succession of neuron layers with interposed synaptic layers each storing a respective set of weights $\{w\}$ for weighting signals propagated between its adjacent neuron layers, via an iterative cycle of signal propagation and weight-update calculation operations. The method includes, for at least one of the synaptic layers, providing a plurality Pl of arrays of memristive devices, each array storing the set of weights of that synaptic layer Sl in respective memristive devices, and, in a signal propagation operation, supplying respective subsets of the signals to be weighted by the synaptic layer Sl in parallel to the Pl arrays. The method also includes, in a weight-update calculation operation, calculating updates to respective weights stored in each of the Pl arrays in dependence on signals propagated by the neuron layers and, for each weight w in the set $\{w\}$, accumulating the updates calculated for that weight in the Pl arrays in an accumulation value $\chi w$ for that weight. The method further comprises periodically programming the memristive devices storing each weight w in all of the Pl arrays to update the stored weight in dependence on the accumulation value $\chi w$ for that weight.

At least one further embodiment of the invention provides apparatus for implementing an artificial neural network in an iterative training cycle of signal propagation and weight-update calculation operations. The apparatus comprises a processing unit and a memcomputing unit. The processing unit is adapted to generate signals propagated by the neuron layers in the propagation operations and to perform the weight-update calculation operations. The memcomputing unit stores the weights $\{w\}$ in respective memristive devices for receiving and weighting signals propagated by the neuron layers to implement the synaptic layers of the network. The memcomputing unit includes a programming circuit for programming the memristive devices and, for at least one of the synaptic layers, a plurality Pl of arrays of memristive devices, each array storing the set of weights of that synaptic layer Sl in respective memristive devices. The memcomputing unit is adapted, in a signal propagation operation, to supply respective subsets of the signals to be weighted by the synaptic layer Sl in parallel to the Pl arrays. The processing unit is adapted, in a weight-update calculation operation, to calculate updates to respective weights stored in each of the Pl arrays in dependence on signals propagated by the neuron layers, and, for each weight w in the set $\{w\}$, to accumulate the updates calculated for that weight in the Pl arrays in an accumulation value $\chi w$ for that weight. The processing unit is further adapted to control the programming circuit to periodically program the memristive devices storing each weight w in all of the Pl arrays to update the stored weight in dependence on the accumulation value $\chi w$ for that weight.

Embodiments of the invention will be described in more detail below, by way of illustrative and non-limiting example, with reference to the accompanying drawings.

BRIEF DESCRIPTION OF THE DRAWINGS

FIG. 8 indicates more detailed steps of the training operation in an embodiment of the invention;

FIG. 9 indicates steps of a weight calibration process in an embodiment of the invention;

FIG. 10 illustrates pipelining of the training operation in an embodiment of the invention.

DETAILED DESCRIPTION

Figure 1:
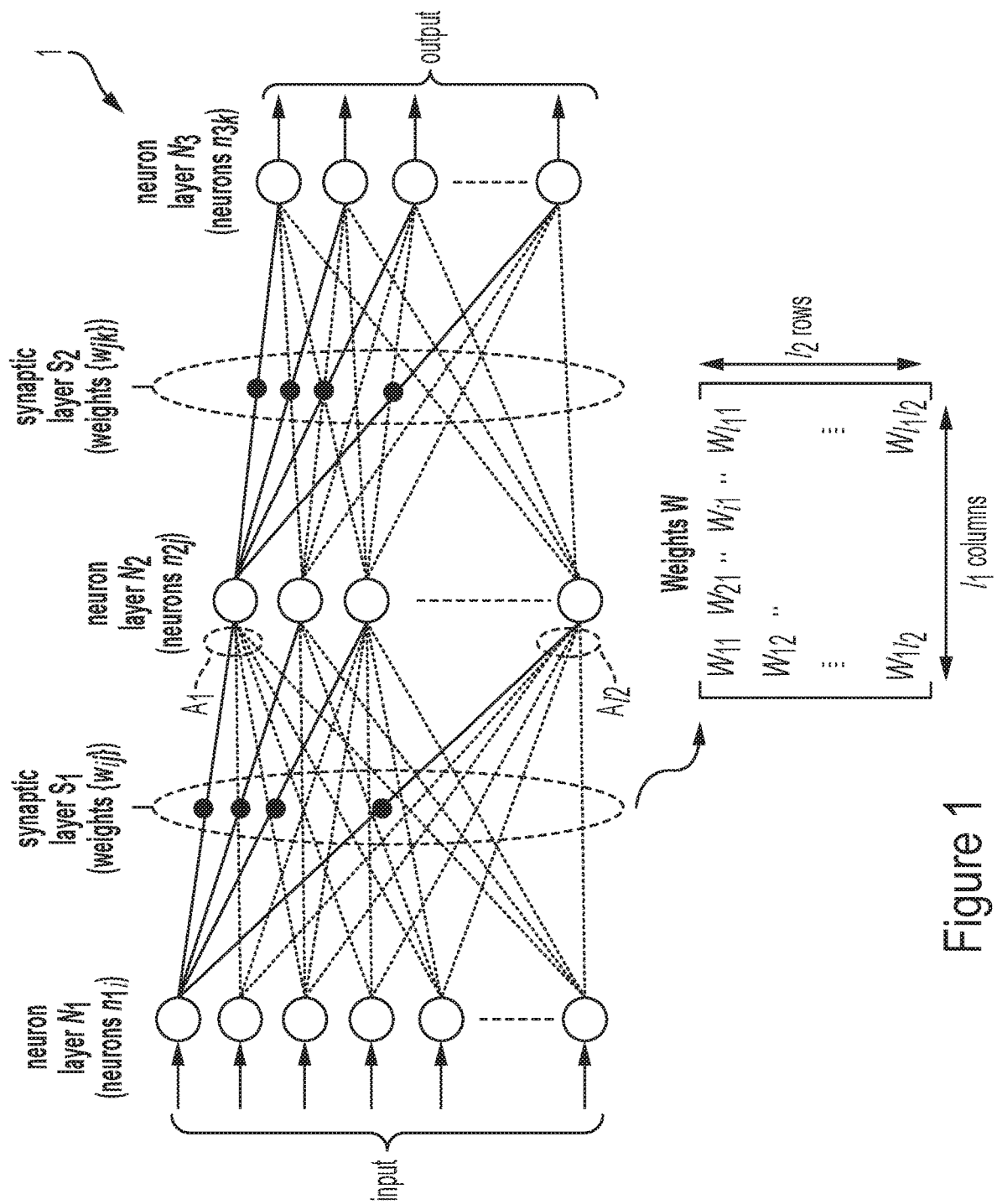
FIG. 1 is a schematic representation of a fully-connected ANN.

FIG. 1 shows the logical structure of an example of a fully-connected ANN. The ANN 1 comprises a succession of neuron layers with interposed synaptic layers. In the simple example shown, the network has three neuron layers: a first layer N1 of input neurons which receive the input data signals; a last layer N3 of output neurons which provide the output signals of the network; and an intermediate ("hidden") layer N2 of neurons between the input and output layers. Neurons in layer N1 are denoted here by n1$i$ ($1 \le i \le l1$), neurons in layer N2 are denoted by n2$j$ ($1 \le j \le l2$), and neurons in layer N3 are denoted by n3$k$ ($1 \le k \le l3$), where $l\times$ is the number of neurons in layer N$x$. All neurons in each layer are connected to all neurons in the next layer as indicated, whereby neuron activation signals from one layer are transmitted to neurons in the next layer. Synaptic layers S1 and S2, interposed with the neuron layers, store respective sets of weights {$w_{ij}$} and {$w_{jk}$} for weighting the signals propagated between their adjacent neuron layers. A weight $w_{ij}$ is defined for each connection between an N1 neuron n1$i$ and an N2 neuron n2$j$, whereby a signal propagated from n1$i$ to n2$j$ is weighted according to the corresponding weight $w_{ij}$ for that neuron pair. The set of weights {$w_{ij}$} for synaptic layer S1 can thus be represented by a matrix W having $l2$ rows and $l1$ columns of weights $w_{ij}$ as indicated in the figure. A signal propagated by an N2 neuron n2$j$ to an N3 neuron n3$k$ is similarly weighted by a corresponding weight $w_{jk}$ of synaptic layer S2, and the set of weights {$w_{jk}$} for synaptic layer S2 can be represented by a matrix having $l3$ rows and $l2$ columns of weights $w_{jk}$.

Input layer neurons can simply transmit their received input data signals as the activation signals for layer N1. For subsequent layers N2 and N3, each neuron n2$j$, n3$k$ generates an activation signal dependent on its accumulated inputs, i.e. the accumulated weighted activation signals from its connected neurons in the previous layer. Each neuron applies a non-linear activation function f to the result A of this accumulation operation to generate its neuron activation signal for onward transmission. For example, the accumulated input $A_j$ to a neuron n2$j$ is given by a dot product computation $A_j = \sum_{i=1}^{l_1}(w_{ij}x_{1i})$, where $x_{1i}$ is the activation signal from neuron n1$i$. Computing the vector A of accumulated inputs ($A_1, A_2 \ldots A_{l_2}$) to neurons n2$j$ can thus be represented by a matrix-vector multiplication Wx between the matrix W of weights $w_{ij}$ and the vector x of activation signals $x_{1i} = (x_{11}, x_{12} \ldots x_{1l_1})$ from neurons n1$i$. Each N2 neuron n2$j$ then generates its activation signal $x_{2j}$ as $x_{2j} = f(A_j)$ for propagation to layer N3.

While a simple example of a fully-connected network is shown in FIG. 1, in general a neuron in any given layer can be connected to one or more neurons in the next layer, and networks can include one or more (commonly up to 30 or more) successive layers of hidden neurons. Neuron layers can include one or more bias neurons (not shown) which do not receive input signals but transmit bias signals to the next neuron layer. Other computations can also be associated with some ANN layers. In some ANNs, e.g. convolutional neural networks (CNNs), neuron layers can comprise three-dimensional volumes of neurons, with associated three-dimensional weight arrays in synaptic layers. This is explained briefly below with reference to FIG. 2.

Figure 2:
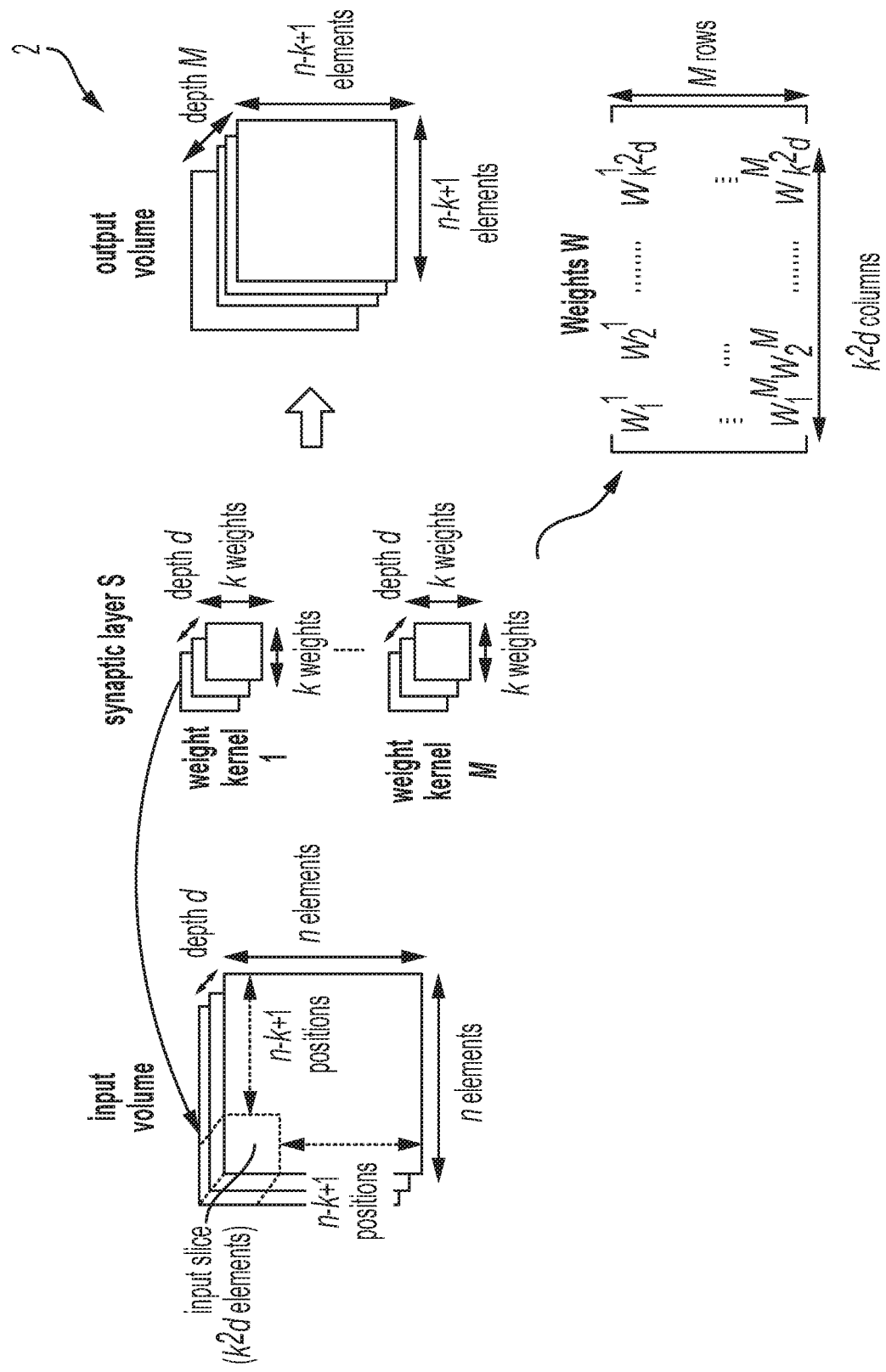
FIG. 2 is a schematic representation of a layer of a convolutional neural network.

FIG. 2 illustrates implementation of a synaptic layer S in an exemplary CNN 2. The input volume to the synaptic layer can be an input training example (e.g. an image of n pixels by n pixels and depth d corresponding to d different color components of the image), or the neuron activations from a preceding neuron layer of dimensions n×n×d neurons. The synaptic layer comprises M weight kernels, each comprising a volume of k×k×d weights as illustrated. Weighted signals are generated by sliding each kernel through positions of the input volume. At each position, a dot product is computed over the kernel weights and signal elements at corresponding locations in the k×k×d slice (shown dotted in the figure for a first kernel position) of the input volume. With a stride of 1, each kernel can slide through (n−k+1) positions both horizontally and vertically in the input volume to produce one plane of the output volume shown on the right of the figure. The complete output volume for all M kernels thus has dimensions (n−k+1)×(n−k+1) and depth M. The elements of this output volume are mapped to neurons in the next layer for further processing.

The set of weights {w} for the M kernels of the convolutional layer can be represented by a matrix W having M rows and k2d columns as indicated in the figure, where each row m=1 to M represents the weights ($w_1^m, w_2^m, \ldots, w_{k_d^2}^m$) of one kernel. The weighting computation can be implemented as a matrix-vector multiplication Wx between the matrix W of weights and a vector x of the k2d signals in each slice of the input volume. The entire computation consists of (n−k+1)2 of these matrix-vector multiplications for the (n−k+1)2 slices of the input volume.

ANN training involves an iterative cycle of signal propagation and weight-update calculation operations in response to a set of training examples which are successively supplied as inputs to the network. For each training example, the signal propagation operation comprises a forward propagation operation and a backpropagation operation. In the forward propagation operation, activation signals are propagated from the first (input) to the last (output) neuron layer in response to the current network input. Hence, activation signals x are weighted and propagated, layer-by-layer through the network, as described above. For each neuron in the output layer, the output signal after forward propagation is compared with the expected output for the current training example to obtain an error signal $\delta$ for that neuron. The error signals for the output layer neurons are then backpropagated through all layers of the network except the input layer, i.e. up to the second neuron layer. Error signals backpropagated between adjacent neuron layers are weighted by the appropriate weights of the interposed synaptic layer. Backpropagation thus results in computation of error signals for each neuron layer except the input layer. Updates to the weights stored in each synaptic layer are then calculated based on the signals propagated by the neuron layers in the forward and backpropagation operations. For example, the update $\Delta w_{ij}$ to a weight $w_{ij}$ between a neuron i in one layer and a neuron j in the next layer can be calculated as $$\Delta w_{ij} = \eta x_i \delta_j$$

where $x_i$ is the forward-propagated activation signal from neuron i; $\delta_j$ is the back-propagated error signal for neuron j; and η is a predefined learning parameter for the network.

Figure 3:
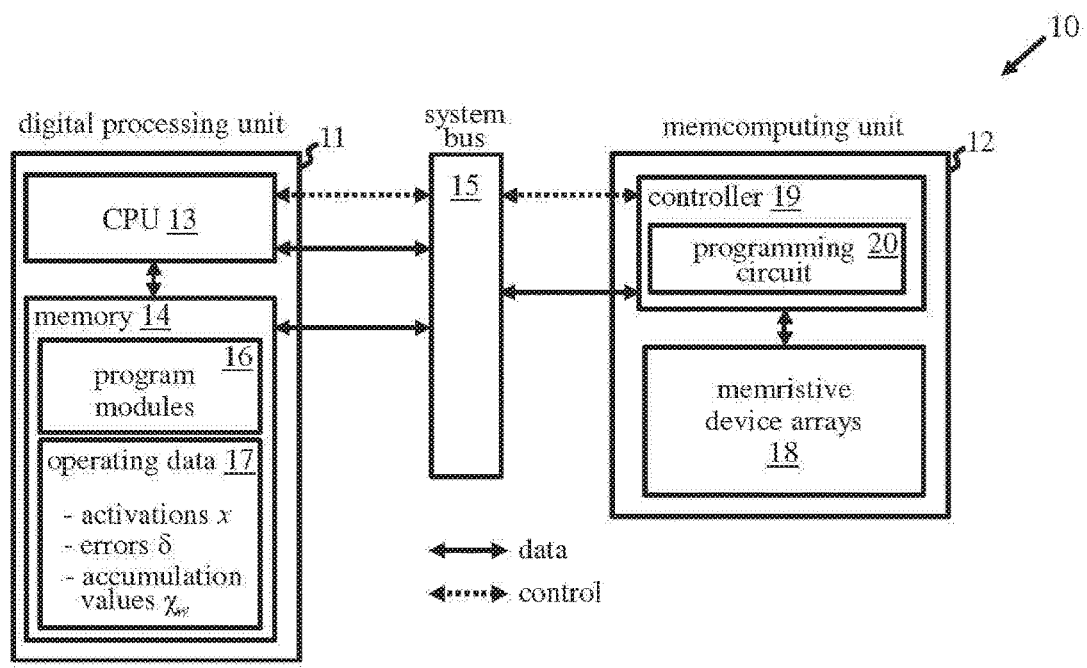
FIG. 3 is a schematic block diagram of apparatus embodying the invention for implementing an ANN in a training operation.

FIG. 3 shows apparatus embodying the invention for implementing an ANN 1, 2 in a training operation. The apparatus 10 comprises a processing unit 11 and a memcomputing unit 12. The processing unit 11 of this embodiment is a digital processing unit (DPU), comprising a central processing unit (CPU) 13 and memory 14, which is operatively coupled via a system bus 15 to memcomputing unit 12. Memory 14 stores one or more program modules 16 comprising program instructions executable by CPU 13 to implement functional steps of operations described below. Memory 14 also stores the operating data which is processed by apparatus 10 in the training operation. The operating data 17 comprises activation signals x and error signals δ, as well as accumulation values χw discussed further below. The memcomputing unit 12 comprises a set of memristive device arrays 18, and a controller 19 for controlling operation of the memcomputing unit. Controller 19 includes a programming circuit 20 for programming devices in memristive arrays 18 as described further below.

The DPU 11 is adapted to generate the activation and error signals propagated by the neuron layers in the forward and backpropagation operations, and to perform the weight-update calculations of the training operation. The propagated signals are supplied via bus 15 to memcomputing unit 11 where controller 19 supplies the signals to memristive device arrays 18. These arrays store the ANN weights in respective memristive devices for receiving and weighting the signals to implement the synaptic layers of the network. The weighted signals from a synaptic layer are returned via bus 15 to DPU 11 which then generates the signals for propagation to the next neuron layer.

Figure 4:
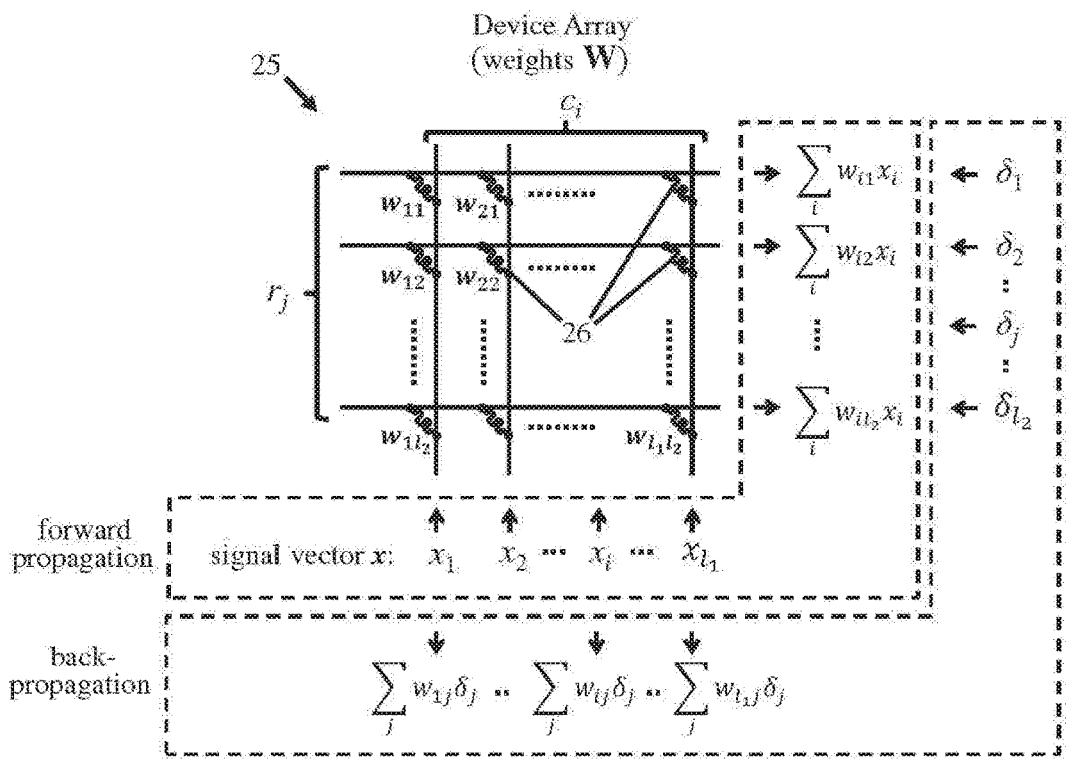
FIG. 4 illustrates structure of a memristive crossbar array in the FIG. 3 apparatus.

In memcomputing unit 12, the set of weights {w} for each synaptic layer is stored in an array 18 of memristive devices in which each device stores a respective weight w of the set. Such an array 18 can be conveniently implemented by a crossbar array of devices, connected between row and column lines, as illustrated in FIG. 4. This example shows a crossbar array 25 storing the weights matrix W for weights {wij} of synaptic layer S1 in the FIG. 1 ANN. Each memristive device 26 in array 25 stores a respective weight wij of the matrix W as indicated. A weight wij corresponds to electrical conductance of the memristive device 26 storing that weight. The devices 26 are arranged in logical rows and columns with each device connected between a particular row line and column line for application of signals to that device. The row and column lines are connected to controller 7 of the memcomputing unit 2 via row and column digital-to-analog/analog-to-digital converters (not shown) which convert array input/output signals between the digital and analog domains.

In a forward propagation operation, controller 19 supplies the activation signals xi to the column lines ci of the array 25. The resulting output signals on row lines rj correspond to weighted sums of the activation signals $\Sigma_i(w_{ij}x_i)$ as indicated. The array 25 thus implements the matrix-vector multiplication Wx for the forward propagation operation. The backpropagation computation can be similarly performed by applying error signals to the row lines to obtain weighted sum signals on the column lines. In particular (although backpropagation is not performed for the first synaptic layer S1 in the specific example of FIG. 1), backpropagation over an array 25 can be performed by supplying error signals $\delta_j$ to respective row lines to obtain the weighted error sums $\Sigma_j(w_{ij}\delta_j)$ on the column lines as indicated.

A memristive device array 18 storing the weights matrix W for a synaptic layer of an ANN 1, 2 can be implemented in one or more such crossbar arrays 25 in memcomputing unit 12. Dense memristive cross-bar arrays can be fabricated as integrated nanoscale systems using well-known material processing techniques, and offer massively parallel and highly area- and energy-efficient implementation of synaptic layer computations. Controller 19 provides the control circuitry for controlling application of signals to memristive devices via the row and column lines of the appropriate arrays. Signals are input to and output from the arrays in the propagation operations, and DPU 11 computes the weight update $\Delta w_{ij} = \eta x_i \delta_j$ for each weight in each synaptic layer as described above. The memristive devices 26 are periodically programmed by programming circuit 20 to update the stored weights accordingly as explained in detail below. The control and programming circuitry of controller 19 can be implemented in generally known manner according to the particular memristive device implementation in arrays 18. A variety of memristive devices are known in the art, e.g. based on resistive memory cells such as phase-change memory (PCM) cells. These devices comprise one or more memory cells which can be arranged in various circuit configurations to store weights $w_{ij}$ in the programmable conductance state of the cells. The conductance state, and hence stored weight $w_{ij}$, can be varied in operation by application of programming signals to a device.

CPU 13 controls performance by apparatus 10 of the iterative training process, described generally above and detailed further below, via execution of program instructions loaded from program modules 16 in memory 14. CPU 13 performs the calculations required in DPU 11 during the training process, and controls input and output of data to/from system bus 15 by DPU 11. CPU 13 also controls programming operations by programming circuit 20 of memcomputing unit 12 via control instructions sent via bus 15 to controller 19.

While an exemplary embodiment of apparatus 10 is described, DPU 11 can comprise one or more CPUs (including GPUs (graphics processing units)) which can be implemented by one or more microprocessors. Memory 14 can comprise one or more data storage entities, and can comprise main memory, e.g. DRAM (dynamic random access memory) and/or other storage which is physically separated from CPU 13, as well as cache and/or other memory local to CPU 13. DPU 11 can be implemented by one or more (general- or special-purpose) computers/programmable data processing apparatus. In general, functional steps performed by a processing unit of apparatus embodying the invention can be implemented by hardware or software or a combination thereof. Controller 19 can also comprise one or more processors which are configurable by software instructions to control memcomputing unit 12 to perform functions described below. In some embodiments, DPU 11 and/or controller 19 can include electronic circuitry such as programmable logic circuitry, field-programmable gate arrays (FPGAs), or programmable logic arrays (PLAs) for implementing functions described. System bus 15 can comprise one or more of several types of bus structures, including a memory bus or memory controller, a peripheral bus, an accelerated graphics port, and a processor or local bus using any of a variety of bus architectures. Some examples include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

In embodiments of this invention, for at least one of the synaptic layers of the ANN, the memcomputing unit 12 includes a plurality Pl of memristive devices arrays 18, and each of these arrays stores the set of weights {w} of that synaptic layer. Respective pluralities Pl of device arrays can be provided for more than one synaptic layer. Embodiments of the invention can provide a plurality of device arrays for every synaptic layer in the network. A synaptic layer implemented by Pl device arrays is denoted by Sl in the following. The network training operation involves an iterative cycle of operations generally as described above. However, for each synaptic layer Sl, the training operation includes particular steps as indicated in FIG. 5.

Figure 5:
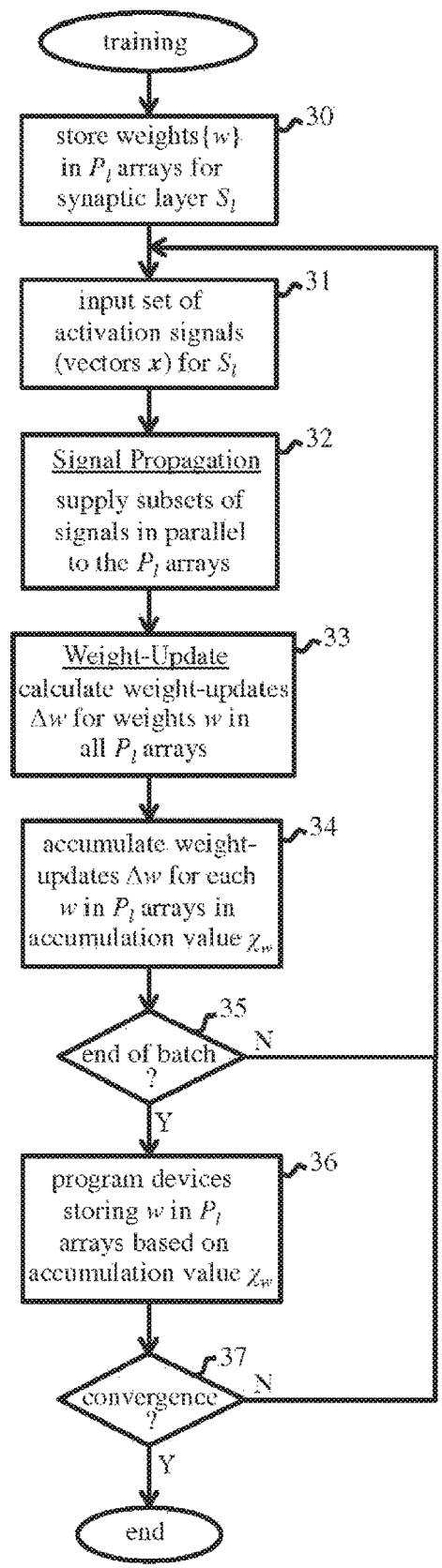
FIG. 5 indicates steps of a training method performed by the FIG. 3 apparatus.

In step 30 of FIG. 5, the initial ANN weights {w} for the synaptic layer Sl are programmed in each of Pl device arrays 18 provided for that layer in memcomputing unit 12. Step 31 represents input to synaptic layer Sl of a set activation signals xi, corresponding to a number of activation vectors x, to synaptic layer Sl in a first cycle of the training operation. The input activation vectors x here can correspond to one or more training examples as explained below. Step 32 represents signal propagation via synaptic layer Sl for this set of signals. In the forward propagation operation, respective subsets of the set of signal vectors (corresponding to respective activation vectors x) are supplied in parallel to the Pl arrays for weighting by the synaptic layer Sl as described above. In the subsequent backpropagation operation, respective subsets (vectors $\delta$) of the error signals $\delta_j$ to be weighted by synaptic layer Sl are similarly supplied in parallel to the Pl arrays. In step 33, DPU 11 performs the weight-update calculation for synaptic layer Sl. Here, DPU 11 calculates updates to respective weights stored in each of the Pl arrays in dependence on the signals propagated to those arrays by the adjacent neuron layers in the forward and backpropagation operations. A weight-update $\Delta w_{ij} = \eta x_i \delta_j$ is thus calculated for a weight $w_{ij}$ in each of the Pl arrays storing weight-set {w}. (In some embodiments, weight-updates $\Delta w_{ij}$ can be computed for all weights $w_{ij}$ in the weight-set {w}. In others, $\Delta w_{ij}$ can be computed for only a subset of weights, e.g. a randomly-selected subset, or weights stored by devices for which $x_i$ and/or $\delta j$ exceed a threshold level.) In step 34, for each weight $w_{ij}$ in weight-set {w}, the DPU 11 accumulates the updates $\Delta w_{ij}$ calculated for that weight in all of the Pl arrays in an accumulation value $\chi w$ for that weight. The accumulation values $\chi w$ are stored in data memory 17. After this step, DPU can overwrite the activations x and errors $\delta$ used for calculating the weight updates in memory 17.

Step 35 represents a decision step in which DPU 11 determines if all signals for a current batch of network inputs have been processed in the network. If not ("N" at step 35), operation reverts to step 31 for the next set of activation signals. When processing of the current batch is complete ("Y") at decision step 35, operation proceeds to step 36. Here, DPU 11 controls the programming circuit 20 of memcomputing controller 19 to program the memristive devices storing each weight $w_{ij}$ in all of the Pl arrays to update the stored weight in dependence on the accumulation value $\chi w$ for that weight. The programming operation is described further below. Step 37 represents a further decision step in which DPU 11 determines if a predetermined convergence condition for the training operation has been achieved. (Convergence can be defined in various known ways, and the particular convergence condition is orthogonal to the operation described herein). If not, operation reverts to step 31 and the training iterations continue. The training operation terminates when convergence is detected at step 37.

In the above operation, the processing of signals by a synaptic layer Sl is performed in parallel by Pl arrays each storing a copy of the weights {w} for the layer. Updates to each individual weight w are calculated and accumulated for all arrays in a single accumulation value $\chi w$, and all arrays are periodically programmed to update the stored weights based on the accumulation values. This offers significantly faster processing by the synaptic layer, while providing a simple weight-update operation based on the accumulation values. A single, "shared" accumulation value is provided for each weight w, and activations and errors can be overwritten after accumulation operations, whereby weight updates can be managed with minimal memory overhead. The weight updates and accumulation values can be calculated with high-precision in DPU 11, and weight-update programming can be performed after a desired number of training iterations, e.g. after processing a batch of training examples. This offers an exceptionally efficient training operation using memristive device arrays for synaptic layer implementation.

Figure 6:
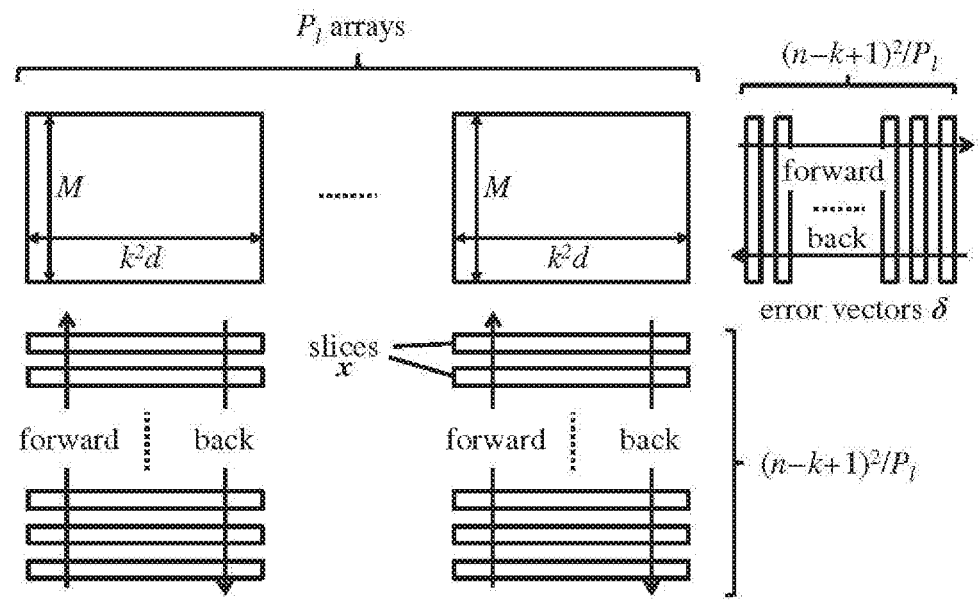
FIG. 6 illustrates operation of the training method for a layer of a convolutional neural network.

FIG. 6 illustrates operation of the above method for the convolutional layer of FIG. 2. Pl device arrays 18 each store the M by $k2d$ weights-matrix W for the layer. Pl activation vectors x, corresponding to respective slices of the input volume, are supplied in parallel to the Pl arrays. The activations x are stored in memory 17. Once the Pl vectors of error signals $\delta j$ have been computed for the next neuron layer on backpropagation, these error vectors $\delta$ are again supplied in parallel to the Pl arrays. The error signals $\delta i$ for the preceding neuron layer are then computed in known manner from the weighted error sums output from the arrays as described above. A weight-update $(\Delta w_{ij})_p = \eta(x_i \delta_j)_p$ is then calculated for each weight $w_{ij}$ in weights matrix W in each of the Pl arrays, and the accumulation value $\chi ij$ for weight $w_{ij}$ is updated as $\chi_{ij} = \chi_{ij} + \Sigma_{p=1}^{Pl}(\Delta w_{ij})_p = \chi_{ij} + \eta \Sigma_{p=1}^{Pl}(x_i \delta_j)_p$. This process continues until all $(n-k+1)2$ input slices of B input volumes for a batch of $B \geq 1$ training examples have been processed. The devices storing weights $w_{ij}$ in all Pl arrays are then programmed to update the weights as described below, and operation continues for the next batch.

Figure 7:
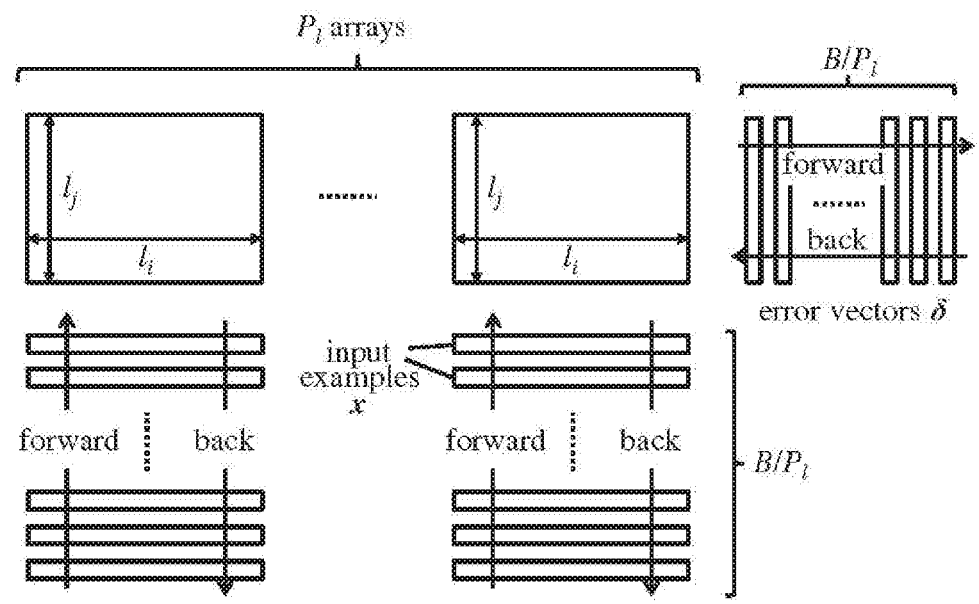
FIG. 7 illustrates operation of the training method for a layer of a fully-connected network.

FIG. 7 illustrates the corresponding operation for a fully-connected network layer of FIG. 1. Here the Pl device arrays 18 each store an lj by li weights-matrix W. Pl activation vectors x, corresponding to respective input examples, are supplied in parallel to the Pl arrays during forward propagation, and the resulting Pl error vectors $\delta$ are backpropagated in parallel by the arrays. The weight-update calculation then accumulates the updates over all Pl arrays in the accumulation values $\chi_{ij} = \chi_{ij} + \eta \Sigma_{p=1}^{Pl}(x_i \delta_j)_p$ as before. The process continues for a batch of B training examples, and the devices storing weights $w_{ij}$ in all Pl arrays are then programmed to update the weights as described below. Operation then continues for the next batch.

FIG. 8 indicates more detailed steps of a programming operation to update the weights $w_{ij}$ in embodiments of the invention. In step 40, for each weight $w_{ij}$ in weight-set {w} for a layer Sl, DPU 11 calculates a number q of programming pulses to be applied to the memristive devices storing that weight. The number q is dependent on the accumulation value $\chi_{ij}$ for the weight $w_{ij}$. In this embodiment, q is calculated as $$q = \left|\frac{\chi_w}{\varepsilon}\right|$$

rounded towards zero, where $\varepsilon$ is a predetermined step-size indicative of weight-change of a memristive device in response to application of one programming pulse. In step 41, DPU 11 instructs controller 19 to apply, via programming circuit 20, q programming pulses to the devices storing $w_{ij}$ in all of the Pl arrays in parallel. In general, $\chi_{ij}$ can be positive or negative, requiring positive or negative updates to the weights. Hence the programming pulses applied here can be potentiation pulses (to increase $w_{ij}$ for positive weight updates) or depression pulses (to decrease $w_{ij}$ for negative weight updates). Programming pulses, and the step size $\varepsilon$, can differ for potentiation and depression depending on characteristics of the memristive devices. Different programming pulses and step sizes c can also be used for devices implementing different synaptic layers in some embodiments. In step 42, DPU 11 then updates the magnitude of the accumulation value $\chi_{ij}$ for weight $w_{ij}$ to $|\chi_{ij}|-q\varepsilon$. Hence, the accumulation value $\chi_{ij}$ is updated to $\chi_{ij}-\text{sign}(\chi_{ij})q\varepsilon$.

With the above programming scheme, all Pl arrays storing a weight-set {w} undergo the same programming sequence. After programming updates, residual weight-update information is retained in the updated accumulation values $\chi_{ij}$ which are stored in high precision in DPU 11. No weight-update information is therefore lost on programming.

While all Pl arrays undergo the same programming sequence, the actual state of corresponding devices in different arrays can vary due to variabilities inherent in memristive devices and/or programming stochasticity. Devices can also saturate due to limited conductance range. This is a particular problem for differential memristive devices which are implemented by a differential configuration of memristive elements. In these devices, the stored weight is represented by the difference in conductance of two elements, one of which receives potentiation pulses and the other of which receives depression pulses. These devices require a frequent refresh operation to reprogram the stored weights. To address these issues, embodiments of apparatus 10 can perform a periodic calibration process to recalibrate weights in the Pl arrays. An example of this process is indicated in FIG. 9. In this embodiment, DPU 11 stores a reference set of digital weight values {W}, corresponding to the set of weights {w} for a synaptic layer Sl, in memory 17 as indicated at step 45. In step 46, each time the stored weights $w_{ij}$ are updated on programming the Pl arrays, the DPU updates the reference digital weights {W} in accordance with the update of each weight $w_{ij}$. In this example with the programming scheme of FIG. 6, each digital weight $W_{ij}$ is updated to $W_{ij}=W_{ij}\pm q\varepsilon$, where the sign depends on whether potentiation (+) or depression (−) pulses are applied on programming the devices. Step 47 of FIG. 9 represents a periodic recalibration of the stored weights in the Pl arrays in dependence on the digital weight values. In this step, DPU reads the reference weights {W}, and the devices storing each weight in all Pl arrays are programmed to the corresponding weight value W.

Periodic recalibration inhibits alteration of the behavior of a network training algorithm due to divergence of weights in the different arrays. In embodiments of the invention employing differential memristive devices, the periodic recalibration can be used to implement the refresh operation for the differential devices, whereby additional refresh operations are unnecessary. Alternatively, refresh can be performed as usual, with recalibration performed less frequently than refresh.

Other recalibration schemes can be envisaged. For example, one of the Pl arrays can be used as a reference for the other arrays. The weights stored in this reference array can be periodically read and used as reference values for reprogramming the corresponding weights in the remaining (Pl−1) arrays. Here, the recalibration process can implement a refresh operation by refreshing only the reference array, and then programming the other arrays based on the refreshed weights in the reference array. As a further example, reference weights could be calculated as the mean weights read-back from a plurality, e.g. all, of the Pl arrays. Calibration can be performed after a predetermined number of training batches, or in a pipelined fashion described further below.

The iterative cycles of the training operation can be pipelined in some embodiments. FIG. 10 illustrates pipelining in an embodiment implementing an ANN with three synaptic layers S1, S2 and S3 having respective weight-sets $\{w_{ij}\}$, $\{w_{jk}\}$ and $\{w_{kl}\}$. Columns in the figure correspond to successive time slots t of the pipelined operation. Lines indicate processing operations for different sets of P1 input vectors x, where P1 is the number of arrays storing weights $\{w_{ij}\}$ of the first synaptic layer S1. For each synaptic layer S2 and S3 after the first, two sets of Pl arrays are provided to store the weight-set of that layer. Hence, two sets of P2 arrays store weight-set $\{w_{jk}\}$, and two sets of P3 arrays store weight-set $\{w_{kl}\}$. Forward propagation across a layer Sl is denoted by Fl in the figure; backpropagation across Sl is denoted by Bl; the output error computation is denoted by Err; and the accumulation-value update process for weight-sets $\{w_{ij}\}$, $\{w_{jk}\}$ and $\{w_{kl}\}$ is denoted by $\chi_{ij}$, $\chi_{jk}$ and $\chi_{kl}$ respectively. With the pipelined operation shown, forward and backpropagation operations across layers S2 and S3 occur concurrently for different sets of input vectors. Hence, the signals to be weighted by each of these layers in forward and backpropagation operations are supplied by controller 19 to respective sets of the (P2 or P3) arrays for that layer. The signal vectors for each line are stored in DPU 11 and only overwritten when that line is finished (after the $\chi_{ij}$ computation).

Pipelined operation continues through the iterative cycle of operations for a batch B of input vectors. At the end of the batch, the pipeline is flushed and the weight arrays are programmed to update all weights based on the resulting accumulation values. For layers S2 and S3 here, devices storing each weight in all arrays of the two sets of P2 or P3 arrays are programmed to update the weights.

The pipelined implementation reduces latency and increases throughput for the training operation. Different numbers Pl of arrays for different synaptic layers Sl can be provided in such embodiments to balance (i.e. equalize as far as possible) propagation delays between successive ANN layers.

Figure 11:
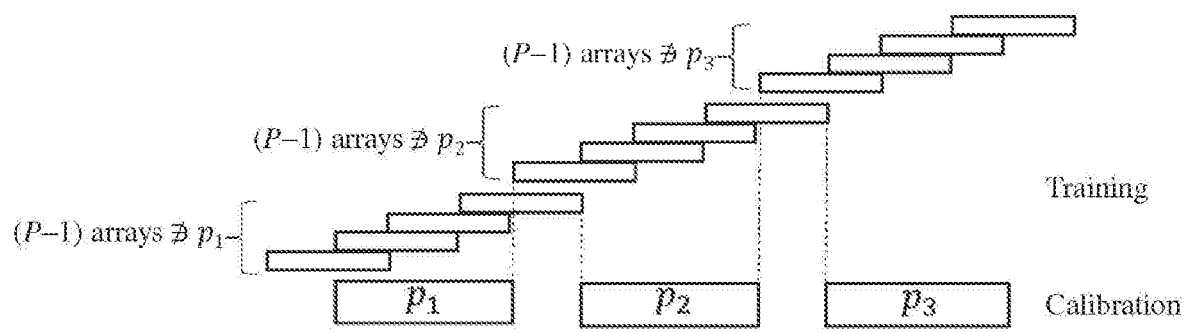
FIG. 11 illustrates cyclic recalibration of memristive device arrays in a pipelined embodiment.

In pipeline embodiments of the invention, recalibration of weight arrays for a synaptic layer can be performed cyclically during the pipelined operation. This is illustrated schematically in FIG. 11 for a layer Sl having a total of P arrays, including an additional array (i.e. in addition to Pl or 2Pl arrays required for the pipelined implementation above) storing the weight-set for that layer. The arrays are denoted by p1, p2, ..., P in the figure. In the operation shown, each of the P arrays is selected in turn for recalibration. The training operations are pipelined as described above using the remaining (P−1) arrays, while the selected array is recalibrated. Recalibration is based on reference values (which can be obtained in a variety of ways as described above) for the weight-set for the synaptic layer. When recalibration of the selected array is complete, this array is returned to the pipeline and the next array is recalibrated. Arrays are thus cyclically selected for recalibration while the pipeline runs continuously using (P−1) arrays. In this way, the pipeline need not be interrupted for recalibration and runs continuously until all vectors have been processed for the current batch.

It will be seen that the above embodiments offer highly-efficient implementation of mixed-precision ANN training. Operation is accelerated via analog processing for synaptic layers in parallel memristive arrays 18, and an efficient weight-update procedure is based on accumulation values calculated by processing unit 11. Significantly faster training can be achieved compared to high-precision digital computing implementations, even for convolutional network layers where the speed-up should be similar to that for fully-connected layers.

Numerous changes and modifications can of course be made to the exemplary embodiments described. For example, while the accumulation values are stored in memory 17 of DPU 11 above, these values can be generated and stored in separate accumulators of a processing unit in other embodiments. Such accumulators can be implemented by any convenient digital or analog (e.g. capacitor-based) circuitry. Different programming schemes can also be envisaged. For example, in some embodiments a single (potentiation or depression) programming pulse can be applied to devices for which the magnitude of the accumulation value $\chi_{ij}$ exceeds some defined threshold.

In general, memristive devices 26 can be implemented in any desired manner, e.g. based on one or a plurality of PCM cells and/or other memristive memory elements in various circuit arrangements. Any type of memristive memory element can be used, e.g. PCM or other resistive memory cells such as resistive RAM (RRAM, or ReRAM) cells including conductive bridge RRAM cells, oxide or metal-oxide RRAM cells, carbon RRAM cells, and magneto-resistive random access memory (MRAM) elements, ferroelectric random access memory (FeRAM) elements, optical memory elements, and circuit devices, e.g. CMOS circuits, comprising transistors, resistors, capacitors, and/or inductors, emulating behavior of memristive elements.

Steps of flow diagrams can be implemented in a different order to that shown and some steps can be performed in parallel where appropriate. In general, where features are described herein with reference to a method embodying the invention, corresponding features can be provided in apparatus embodying the invention, and vice versa.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special-purpose hardware-based systems that perform the specified functions or acts or carry out combinations of special-purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for training an artificial neural network, having a succession of neuron layers with interposed synaptic layers each storing a respective set of weights $\{w\}$ for weighting signals propagated between its adjacent neuron layers, via an iterative cycle of signal propagation and weight-update calculation operations, the method comprising for at least one of said synaptic layers:

providing a plurality of Pl arrays of memristive devices, each array storing the set of weights of that synaptic layer Sl in respective memristive devices;

in said signal propagation operation, supplying respective subsets of the signals to be weighted by the synaptic layer Sl in parallel to the Pl arrays;

in said weight-update calculation operation, calculating updates to respective weights stored in each of the Pl arrays in dependence on signals propagated by the neuron layers and, for each weight w in said set, accumulating the updates calculated for that weight in the Pl arrays in an accumulation value $\chi w$ for that weight;

periodically programming the memristive devices storing each weight w in all of the Pl arrays to update a stored weight in dependence on the accumulation value $\chi w$ for that weight, wherein programming the memristive devices comprises applying a number q, dependent on said accumulation value $\chi w$, of programming pulses to the memristive devices; and updating a magnitude of the accumulation value $\chi w$ for that respective weight w to $|\chi w| - q\varepsilon$, where $\varepsilon$ is a predetermined step-size indicative of weight-change of a memristive device in response to application of said programming pulse.

2. A method as claimed in claim 1 wherein $$q = \left|\frac{\chi w}{\varepsilon}\right|$$

rounded towards zero.

3. A method as claimed in claim 1 including periodically recalibrating one or more stored weights in the Pl arrays in dependence on reference values for the set of weights for the synaptic layer Sl.

4. A method as claimed in claim 3 including determining said reference values in dependence on read-back weights from at least one of the Pl arrays.

5. A method as claimed in claim 3 including:
storing a set of digital weight values corresponding to the set of weights for the synaptic layer Sl;
updating the set of digital weight values in accordance with said update of each stored weight w on programming the memristive devices in the Pl arrays; and
periodically recalibrating the stored weights in the Pl arrays in dependence on the set of digital weight values.

6. A method as claimed in claim 3 wherein each memristive device in the Pl arrays comprises a differential memristive device, the method including performing a periodic recalibration of the stored weights in the Pl arrays to implement a refresh operation for the differential memristive devices.

7. A method as claimed in claim 1 including providing said plurality of P1 arrays of memristive devices for every synaptic layer in the artificial neural network.

8. A method as claimed in claim 1 wherein each said signal propagation operation comprises a forward propagation operation, in which activation signals are propagated from a first to a last neuron layer of the artificial neural network in response to a network input, and a backpropagation operation in which error signals are propagated from the last neuron layer to a second neuron layer, the method including:
for each said synaptic layer Sl after the first synaptic layer of the artificial neural network, providing two sets of P1 arrays of memristive devices storing the set of weights of that synaptic layer;
pipelining said iterative cycle of operations for a batch of network inputs such that signals to be weighted by each synaptic layer Sl in said forward propagation and backpropagation operations are supplied to respective sets of P1 arrays for that synaptic layer; and
at the end of said iterative cycle of operations for the batch, programming the memristive devices storing each weight w in all arrays of the two sets of P1 arrays for each synaptic layer Sl to update the stored weight in dependence on said accumulation value xw for that weight.

9. A method as claimed in claim 8 including providing different numbers P1 of arrays for different synaptic layers Sl to balance propagation delays between successive neuron layers of the artificial neural network.

10. A method as claimed in claim 8 including, for each synaptic layer Sl:
providing an additional array of memristive devices storing the set of weights for that layer;
during said iterative cycle of operations for the batch, cyclically selecting one of the arrays for that synaptic layer, pipelining said operations using the remaining arrays for that synaptic layer, and recalibrating the stored weights in the cyclically selected array in dependence on reference values for the set of weights for the synaptic layer.

11. Apparatus for implementing an artificial neural network, having a succession of neuron layers with interposed synaptic layers each storing a respective set of weights $\{w\}$ for weighting signals propagated between its adjacent neuron layers, in an iterative training cycle of signal propagation and weight-update calculation operations, the apparatus comprising:
a processor adapted to generate signals propagated by the neuron layers in said propagation operations and to perform said weight-update calculation operations; and
a memcomputing unit storing said weights in respective memristive devices for receiving and weighting signals propagated by the neuron layers to implement the synaptic layers of the artificial neural network, the memcomputing unit including a programming circuit for programming the memristive devices and, for at least one of the synaptic layers, a plurality of P1 arrays of memristive devices, each array storing the set of weights of that synaptic layer Sl in respective memristive devices;
wherein the memcomputing unit is adapted, in said signal propagation operation, to supply respective subsets of the signals to be weighted by the synaptic layer Sl in parallel to the P1 arrays;
wherein the processor is adapted, in said weight-update calculation operation, to calculate updates to respective weights stored in each of the P1 arrays in dependence on signals propagated by the neuron layers, and, for each weight w in said set, to accumulate the updates calculated for that weight in the P1 arrays in an accumulation value xw for that weight;
wherein the processor is adapted to control said programming circuit to periodically program the memristive devices storing each weight w in all of the P1 arrays to update a stored weight in dependence on the accumulation value xw for that weight;
and wherein the apparatus is adapted:
to program the memristive devices storing said weight w in the P1 arrays by applying a number q, dependent on said accumulation value xw, of programming pulses to the memristive devices; and
to update a magnitude of the accumulation value Xw for that respective weight w to JXwl−qE, where F is a predetermined step-size indicative of weight-change of a memristive device in response to application of said programming pulse.

12. Apparatus as claimed in claim 11 wherein $$q = \left\lfloor \frac{X_w}{\varepsilon} \right\rfloor$$

rounded towards zero.

13. Apparatus as claimed in claim 11, the apparatus being further adapted to periodically recalibrate one or more stored weights in the Pl arrays in dependence on reference values for the set of weights for the synaptic layer Sl.

14. Apparatus as claimed in claim 13, the apparatus being adapted to determine said reference values in dependence on read-back weights from at least one of the Pl arrays.

15. Apparatus as claimed in claim 13 wherein:
the processor is adapted to store a set of digital weight values corresponding to the set of weights for the synaptic layer Sl, and to update the set of digital weight values in accordance with said update of each stored weight w on programming the memristive devices in the Pl arrays; and
the apparatus is adapted to periodically recalibrate the stored weights in the Pl arrays in dependence on the set of digital weight values.

16. Apparatus as claimed in claim 11 wherein the memcomputing unit includes said plurality of P1 arrays of memristive devices for every synaptic layer in the artificial neural network.

17. Apparatus as claimed in claim 11 wherein each said signal propagation operation comprises a forward propagation operation, in which activation signals are propagated from a first to a last neuron layer of the artificial neural network in response to a network input, and a backpropagation operation in which error signals are propagated from the last neuron layer to a second neuron layer, and wherein, for each said synaptic layer Sl after the first synaptic layer of the artificial neural network, the memcomputing unit includes two sets of P1 arrays of memristive devices storing the set of weights of that synaptic layer, the apparatus being adapted:
to pipeline said iterative cycle of operations for a batch of network inputs such that signals to be weighted by each synaptic layer Sl in said forward propagation and backpropagation operations are supplied to respective sets of P1 arrays for that synaptic layer; and at the end of said iterative cycle of operations for the batch, to program the memristive devices storing each weight w in all arrays of the two sets of P1 arrays for each synaptic layer Sl to update the stored weight in dependence on said accumulation value xw for that weight.

18. Apparatus as claimed in claim 17 wherein, for each synaptic layer Sl, the memcomputing unit includes an additional array of memristive devices storing the set of weights for that layer, the apparatus being adapted, during said iterative cycle of operations for the batch, to cyclically select one of the arrays for that synaptic layer Sl, to pipeline said operations using the remaining arrays for that synaptic layer, and to recalibrate the stored weights in the cyclically selected array in dependence on reference values for the set of weights for the synaptic layer.

* * * * *